United States Patent [19]

Battersby

[11] Patent Number: 5,652,716
[45] Date of Patent: Jul. 29, 1997

[54] METHOD FOR SIMULATING DISTRIBUTED EFFECTS WITHIN A DEVICE SUCH AS A POWER SEMICONDUCTOR DEVICE

[75] Inventor: Stephen J. Battersby, Haywards Heath, England

[73] Assignee: U.S. Philips Corporation, New York, N.Y.

[21] Appl. No.: 288,672

[22] Filed: Aug. 10, 1994

[30] Foreign Application Priority Data

Aug. 13, 1993 [GB] United Kingdom .................. 9316856

[51] Int. Cl.$^6$ .............................. G06G 7/48; G06F 17/13
[52] U.S. Cl. ........................... 364/578; 395/500; 395/920
[58] Field of Search .................................. 364/578, 488; 395/500, 920

[56] References Cited

U.S. PATENT DOCUMENTS

| | | | |
|---|---|---|---|
| 4,742,473 | 5/1988 | Shugar et al. | 364/578 |
| 4,866,663 | 9/1989 | Griffin | 364/578 |
| 5,029,119 | 7/1991 | Konna | 364/578 |
| 5,148,379 | 9/1992 | Konno et al. | 364/578 |
| 5,313,398 | 5/1994 | Rohrer et al. | 364/578 |
| 5,408,638 | 4/1995 | Sagawa et al. | 395/500 |

OTHER PUBLICATIONS

Saber Tutorial, Release 3.1a. (Analogy, Inc., London UK Feb. 1987) introductory pages.
L.W. Nagel, "Electronics Research Laboratory Report", ERL–M520,. (Dissertation, UCA Berkeley, California 1975) pp. iii–ix, 1–48, A2.1–54.
Semiconductor Device Modeling with SPICE, edited by P. Antognetti and G. Massobrio, Chapters 1 and 8 and the table of contents.

Philips Electronic Design & Tools, PSTAR user Guide, Version 1.10. (Philips Electronics NV Jan. 1992) introductory pages.

*Primary Examiner*—Kevin J. Teska
*Assistant Examiner*—Tyrone V. Walker
*Attorney, Agent, or Firm*—Anne E. Barschall

[57] ABSTRACT

A method for simulating distributed effects within a device such as a power semiconductor device, more particularly a method for generating a simulation program for automatically simulating time dependent characteristics of a device to enable the operation of the device within a larger circuit to be simulated by a circuit simulator program which contains a computer model of the device to facilitate the designing of circuits incorporating such a device is described. In this method a computer system is used to solve a time dependent differential equation, for example the time dependent ambipolar diffusion equation for a semiconductor device, using boundary conditions which define the time dependent characteristics as evolving at a constant rate for a given time interval such that only a small number of transient terms are required for the solution and using the solution of the time dependent differential equation to modify the computer model of the device contained within the simulator program to enable the time dependent characteristics of the device to be simulated. Such a method enables the distributed effects of a device to be simulated in a circuit simulation.

14 Claims, 15 Drawing Sheets

$$\frac{\partial^2 P(x,t)}{\partial x^2} = \frac{P(x,t)}{L^2} + \frac{1}{D}\frac{\partial P(x,t)}{\partial t} \tag{1}$$

$$P(0,t) = P_0 = p_o + m_o t, \quad P(w,t) = P_w = p_w + m_w t \tag{2}$$

$$m_o = \frac{dP(0,t)}{dt}, \quad m_w = \frac{dP(w,t)}{dt}, \quad p_o = P(0,0), \quad p_w = P(w,0) \tag{3}$$

$$L(f(t)) = \int_0^\infty f(t)e^{-st}dt = \frac{\partial^2 \hat{P}(x,t)}{\partial x^2} = \frac{\hat{P}}{L^2} + \frac{1}{D}s\hat{P} - \frac{1}{D}\hat{P}(x,0) \tag{4}$$

$$\frac{\hat{P}}{D}(s+T), \quad T = \frac{L^2}{D} \tag{4a}$$

$$\hat{P}(0,s) = \frac{p_o}{s} + \frac{1}{s^2}m_o, \quad \hat{P}(w,s) = \frac{p_w}{s} + \frac{1}{s^2}m_w \tag{5}$$

$$\hat{P}(x,s) = A\sinh((w-x)\alpha) + B\sinh((x)\alpha), \quad \alpha = \sqrt{\frac{(s+\frac{1}{T})}{D}} \tag{6}$$

$$\hat{P}(0,s) = A\sinh(w\alpha) = \frac{p_o}{s} + \frac{1}{s^2}m_o, \quad A = \frac{\frac{p_o}{s}+\frac{1}{s^2}m_o}{\sinh(w\alpha)}$$

$$\hat{P}(w,s) = B\sinh(w\alpha) = \frac{p_w}{s} + \frac{1}{s^2}m_w, \quad B = \frac{\frac{p_w}{s}+\frac{1}{s^2}m_w}{\sinh(w\alpha)} \tag{7}$$

$$\hat{P}(x,s) = \frac{1}{\sinh(w\alpha)}\left(\left(\frac{p_o}{s}+\frac{1}{s^2}m_o\right)\sinh((w-x)\alpha) + \left(\frac{p_w}{s}+\frac{1}{s^2}m_w\right)\sinh(x\alpha)\right) \tag{8}$$

$$\mathcal{L}^{-1}f(t).\mathcal{L}^{-1}g(t) = \frac{2\pi}{T}\sum_{n=1}^\infty -(-1)^n n \sin\left(\frac{n\pi x}{w}\right)e^{-\frac{t}{T_n}}\int_0^t (p_w + m_w u)e^{\frac{u}{T_n}}du \tag{9}$$

$$\frac{w^2}{D} = T, \quad \frac{1}{T} + \frac{n^2\pi^2}{T} = \frac{1}{T_n}$$

FIG. 10A $$\frac{2\pi}{T}\sum_{n=1}^{\infty} -(-1)^n n \sin(\frac{n\pi x}{w})T_n\left\{p_w(1-e^{-\frac{t}{T_n}})+m_w(t-T_n(1-e^{-\frac{t}{T_n}}))\right\} \qquad (10)$$

$$\mathcal{L}^{-1}\left(\frac{1}{\sinh(\alpha w)}\left((\frac{p_o}{s}+\frac{m_o}{s^2})\sinh(w-x)\alpha\right)\right)$$

$$=\frac{2\pi}{T}\sum_{n=1}^{\infty} -(-1)^n n \sin(\frac{n\pi(w-x)}{w})T_n\left\{p_o(1-e^{-\frac{t}{T_n}})+m_o[t-T_n(1-e^{-\frac{t}{T_n}})]\right\} \qquad (11)$$

$$P(x,t)=\frac{2\pi}{T}\sum_{n=1}^{\infty} n \sin(\frac{n\pi x}{w})\left[T_n\left((p_o+m_o t)-(-1)^n(p_w+m_w t)\right)-T_n^2\left(m_o-(-1)^n m_w\right)\right.$$
$$\left.-T_n\left(p_o-(-1)^n p_w\right)e^{-\frac{t}{T_n}}+T_n^2\left(m_o-(-1)^n m_w\right)e^{-\frac{t}{T_n}}\right] \qquad (12)$$

$$\sinh ax = 2\frac{\sinh a\pi}{\pi}\sum_{n=1}^{\infty} -(-1)^n \left(\frac{n\sin nx}{n^2+a^2}\right) \qquad (13)$$

$-\pi < x < \pi$ $X = Wx/\pi$ $$\sinh(\frac{a\pi X}{w}) = 2\frac{\sinh a\pi}{\pi}\sum_{n=1}^{\infty} -(-1)^n \left(\frac{n\sin(\frac{n\pi X}{w})}{n^2+a^2}\right) \qquad (14)$$

$-w < X < w$ $a = w/\pi L$ $$\sinh\frac{X}{L} = 2\frac{\pi D}{w^2}\sinh\frac{w}{L}\sum_{n=1}^{\infty} -(-1)^n T_n n \sin\frac{n\pi X}{w} \qquad (15)$$

FIG. 10B $$\sinh\frac{(w-X)}{L} = 2\frac{\pi D}{w^2}\sinh\frac{w}{L}\sum_{n=1}^{\infty}\tau_n n \sin\frac{n\pi X}{w} \qquad (16)$$

$$\left(p_o+m_o t\right)\frac{\sinh\frac{(w-x)}{L}}{\sinh\frac{w}{L}} + \left(p_w+m_w t\right)\frac{\sinh\frac{x}{L}}{\sinh\frac{w}{L}} \qquad (17)$$

$$=\frac{2\pi D}{w^2}\sum_{n=1}^{\infty}n\sin\frac{n\pi x}{w}\left((p_o+m_o t)-(-1)^n(p_w+m_w t)\right)\tau_n$$

$$m_o\left[\frac{\sinh\frac{x}{L}}{\sinh\frac{w}{L}}-\frac{x}{w}\cosh\frac{(w-x)}{L}\right] + m_w\left[\frac{\sinh\frac{w-x}{L}}{\sinh\frac{w}{L}}-\frac{w-x}{w}\cosh\frac{x}{L}\right] \qquad (18)$$

$$= g(x)m_o + g(w-x)m_w$$

$$g(x) = \sum_{n=1}^{\infty} b_n \sin\frac{n\pi x}{w}, \quad b_n = \frac{1}{w}\int_{-w}^{w}g(x)\sin\frac{n\pi x}{w}dx = \frac{2}{w}\int_{0}^{w}g(x)\sin\frac{n\pi x}{w}dx$$

$$g(w-x) = \sum_{n=1}^{\infty} b^1_n \sin\frac{n\pi x}{w}, \quad b^1_n = \frac{2}{w}\int_{0}^{w}g(w-x)\sin\frac{n\pi x}{w}dx \qquad (19)$$

$$X = w-x$$

$$b^1_n = -\frac{2}{w}\int_{w}^{0}g(X)\sin n\pi(\frac{w-X}{w})dx = (-1)^n b_n$$

$$b_n = -\frac{4n\pi D^2}{Lw^3}\cdot\tau_n^2 \sinh\frac{w}{L} \qquad (20)$$

$$g(x)m_o + g(w-x)m_w = \frac{2D}{Lw}\sinh\frac{w}{L}\left(-\frac{2\pi D}{w^2}\sum_{n=1}^{\infty}n\tau_n^2\sin\frac{n\pi x}{w}(m_o-(-1)^n m_w)\right) \qquad (21)$$

$$-\frac{2\pi D}{w^2}\sum_{n=1}^{\infty}n\tau_n^2\sin\frac{n\pi x}{w}(m_o-(-1)^n m_w) = \frac{w\tau}{2L\sinh\frac{w}{L}}\left(g(x)m_o + g(w-x)m_w\right) \qquad (22)$$

FIG. 10C $$P(x,t) = (p_o + m_o t)\frac{\sinh\frac{(w-x)}{L}}{\sinh\frac{w}{L}} + (p_w + m_w t)\frac{\sinh\frac{x}{L}}{\sinh\frac{w}{L}}$$

$$+ \frac{wT}{2L\sinh\frac{w}{L}} m_o \left[\frac{\sinh\frac{x}{L}}{\sinh\frac{w}{L}} - \frac{x}{w}\cosh\frac{(w-x)}{L}\right]$$

(23)

$$+ \frac{wT}{2L\sinh\frac{w}{L}} m_w \left[\frac{\sinh\frac{(w-x)}{L}}{\sinh\frac{w}{L}} - \frac{(w-x)}{w}\cosh\frac{x}{L}\right]$$

$$+ \frac{2\pi D}{w^2} \sum_{n=1}^{\infty} n\sin\frac{n\pi x}{w} \cdot \left[(m_o - (-1)^n m_w)\tau_n^2 e^{-\frac{t}{\tau_n}}\right]$$

$$+ \frac{2\pi D}{w^2} \sum_{n=1}^{\infty} n\sin\frac{n\pi x}{w} \cdot \left[-(p_o - (-1)^n p_w)\tau_n e^{-\frac{t}{\tau_n}}\right] \qquad (24)$$

$$K_1(t)\sin\frac{\pi x}{w} + K_2(t)\sin\frac{2\pi x}{w} + K_3(t)\sin\frac{3\pi x}{w} \qquad (25)$$

$$K_n = +\frac{2\pi D}{w^2} n(m_o - (-1)^n m_w)\tau_n^2 e^{-\frac{t}{\tau_n}} \qquad (26)$$

$$\frac{wT}{2L\sinh\frac{w}{L}}\left[m_o\int_0^w g(x)dx + m_w\int_0^w g(w-x)dx\right]$$

(27)

$$+ K_1\int_0^w \sin\frac{\pi x}{w}dx + K_2\int_0^w \sin\frac{2\pi x}{w}dx + K_3\int_0^w \sin\frac{3\pi x}{w}dx = 0$$

FIG. 10D $$K_1 = \frac{T}{32\pi \sinh\frac{w}{L}} (m_o+m_w) \left( \frac{\cosh\frac{w}{L} - 1}{\sinh\frac{w}{L}} \right) \cdot$$

$$\left[ 9\pi^2 \left( \frac{\sinh\frac{w}{L}}{\frac{w}{L}} - 1 \right) - \left(\frac{w}{L}\right)^2 \left( \frac{\sinh\frac{w}{L}}{\frac{w}{L}} + 1 \right) \right] \quad (28)$$

$$K_2 = \frac{T}{8\pi \sinh\frac{w}{L}} (m_o-m_w) \left( \frac{\cosh\frac{w}{L} + 1}{\sinh\frac{w}{L}} \right) \cdot \left[ \left(\frac{w}{L}\right)^2 \left( \frac{\sinh\frac{w}{L}}{\frac{w}{L}} - 1 \right) \right] \quad (29)$$

$$K_3 = \frac{3T}{32\pi \sinh\frac{w}{L}} (m_o+m_w) \left( \frac{\cosh\frac{w}{L} - 1}{\sinh\frac{w}{L}} \right) \cdot$$

$$\left[ \left(\frac{w}{L}\right)^2 \left( \frac{\sinh\frac{w}{L}}{\frac{w}{L}} + 1 \right) - \pi^2 \left( \frac{\sinh\frac{w}{L}}{\frac{w}{L}} - 1 \right) \right] \quad (30)$$

$$P(x,t) = (p_o + m_{o1}t) \frac{\sinh\frac{(w-x)}{L}}{\sinh\frac{w}{L}} + (p_w + m_{w1}t) \frac{\sinh\frac{x}{L}}{\sinh\frac{w}{L}}$$

$$+ \frac{wT}{2L \sinh\frac{w}{L}} m_{o1} \left[ \frac{\sinh\frac{x}{L}}{\sinh\frac{w}{L}} - \frac{x}{w} \cosh\frac{(w-x)}{L} \right] \quad (31)$$

$$+ \frac{wT}{2L \sinh\frac{w}{L}} m_{w1} \left[ \frac{\sinh\frac{(w-x)}{L}}{\sinh\frac{w}{L}} - \frac{(w-x)}{w} \cosh\frac{x}{L} \right]$$

$$+ \sum_{n=1}^{\infty} B_n e^{-\frac{t}{T_n}} \sin\frac{n\pi x}{w}$$

FIG. 10E $$B_n e^{-\frac{t}{T_n}} \tag{32}$$

$$P(x,t_x) = \left(p_o + m_{o1} t_0\right) \frac{\sinh\frac{(w-x)}{L}}{\sinh\frac{w}{L}} + \left(p_w + m_{w1} t_0\right) \frac{\sinh\frac{x}{L}}{\sinh\frac{w}{L}}$$

$$+ \frac{WT}{2L \sinh\frac{w}{L}} m_{o1} \left[ \frac{\sinh\frac{x}{L}}{\sinh\frac{w}{L}} - \frac{x}{w} \cosh\frac{(w-x)}{L} \right] \tag{33}$$

$$+ \frac{WT}{2L \sinh\frac{w}{L}} m_{w1} \left[ \frac{\sinh\frac{(w-x)}{L}}{\sinh\frac{w}{L}} - \frac{(w-x)}{w} \cosh\frac{x}{L} \right]$$

$$+ \sum_{n=1}^{\infty} B_n e^{-\frac{t_0}{T_n}} \sin\frac{n\pi x}{w}$$

$$P(x,t_y) = \left(p_o + m_{o1} t_0 + m_{o2}(t-t_0)\right) \frac{\sinh\frac{(w-x)}{L}}{\sinh\frac{w}{L}} + \left(p_w + m_{w1} t_0 + m_{w2}(t-t_0)\right) \frac{\sinh\frac{x}{L}}{\sinh\frac{w}{L}}$$

$$+ \frac{WT}{2L \sinh\frac{w}{L}} m_{o2} \left[ \frac{\sinh\frac{x}{L}}{\sinh\frac{w}{L}} - \frac{x}{w} \cosh\frac{(w-x)}{L} \right] \tag{34}$$

$$+ \frac{WT}{2L \sinh\frac{w}{L}} m_{w2} \left[ \frac{\sinh\frac{(w-x)}{L}}{\sinh\frac{w}{L}} - \frac{(w-x)}{w} \cosh\frac{x}{L} \right]$$

$$+ \sum_{n=1}^{\infty} C_n e^{-\frac{(t-t_0)}{T_n}} \sin\frac{n\pi x}{w}$$

FIG. 10F $$C_n \Rightarrow B_n(t_0) = B_n(0) e^{-\frac{t_0}{T_n}} + \frac{2\pi Dn}{w^2} T_n^2 \left( (m_{o2}-m_{o1}) - (-1)^n (m_{w2}-m_{w1}) \right) \quad (35)$$

$$B_n(t_0) = B_n(0)\left(1 - \frac{t_0}{T_n}\right) + \frac{2\pi Dn}{w^2} T_n^2 \left( (m_{o2}-m_{o1}) - (-1)^n (m_{w2}-m_{w1}) \right) \quad (36)$$

$$\frac{B_n(t_0) - B_n(0)}{t_0} = -\frac{B_n(0)}{T_n} + \frac{2\pi Dn}{w^2} T_n^2 \left( \frac{(m_{o2}-m_{o1})}{t_0} - (-1)^n \frac{(m_{w2}-m_{w1})}{t_0} \right) \quad (37)$$

$$\frac{dB_n}{dt} = -\frac{B_n}{T_n} + \frac{2\pi Dn}{w^2} T_n^2 \left( \frac{dm_o}{dt} - (-1)^n \frac{dm_w}{dt} \right) \quad (38)$$

$$\begin{aligned} C_K &= 1 \\ \frac{1}{R_K} &= \frac{1}{T_n} \\ I_K(t) &= \frac{2\pi Dn}{w^2} T_n^2 \left( \frac{dm_o}{dt} - (-1)^n \frac{dm_w}{dt} \right) \end{aligned} \quad (39)$$

$$I_K(t) = \frac{B_n}{R_K} + C_K \frac{dB_n}{dt} \quad (40)$$

$$V = \frac{KT}{Q} \ln\left(\frac{N_A}{P_w}\right) + \frac{KT}{Q} \ln\left(\frac{N_D}{N_{Di}+P_o}\right) + V_i(P_w, P_o, I) \quad (41)$$

$$\begin{aligned} I_p &= \frac{I_D}{(1+b)} - qA(hP_w^2 + sP_w) \\ I_n &= \frac{bI_D}{(1+b)} - qA(hP_o^2 + sP_o) \end{aligned} \quad (42)$$

FIG. 10G $$I_o = -qDA \frac{\partial P}{\partial x}\Big|_{x=0}$$

$$I_w = qDA \frac{\partial P}{\partial x}\Big|_{x=w} \qquad (43)$$

$$I_o = -qDA \left( -\frac{p_o}{L} \frac{\cosh\frac{w}{L}}{\sinh\frac{w}{L}} + \frac{p_w}{L} \frac{1}{\sinh\frac{w}{L}} \right)$$

$$-qDA \frac{T}{2L\sinh\frac{w}{L}} \left[ m_o\left(\frac{\frac{w}{L}}{\sinh\frac{w}{L}} - \cosh\frac{w}{L}\right) + m_w\left(1 - \frac{\frac{w}{L}\cosh\frac{w}{L}}{\sinh\frac{w}{L}}\right) \right] \qquad (44)$$

$$-qDA\left(K_1\frac{\pi}{w} + K_2\frac{2\pi}{w} + K_3\frac{3\pi}{w}\right)$$

$$I_w = qDA \left( -\frac{p_o}{L} \frac{1}{\sinh\frac{w}{L}} + \frac{p_w}{L} \frac{\cosh\frac{w}{L}}{\sinh\frac{w}{L}} \right)$$

$$+qDA \frac{T}{2L\sinh\frac{w}{L}} \left[ m_o\left(\frac{\frac{w}{L}\cosh\frac{w}{L}}{\sinh\frac{w}{L}} - 1\right) + m_w\left(\cosh\frac{w}{L} - \frac{\frac{w}{L}}{\sinh\frac{w}{L}}\right) \right] \qquad (45)$$

$$+qDA\left(-\frac{\pi}{w}K_1 + \frac{2\pi}{w}K_2 - \frac{3\pi}{w}K_3\right)$$

$$(I_o - I_{Y1}) = P_o Y_2 \ , \ (I_w - I_{Y1}) = P_w Y_2 \qquad (46)$$

$$I_{Y1} = (P_o - P_w) Y_1 \qquad (47)$$

FIG. 10H $$Y_2 = \frac{(I_o + I_w)}{(P_o + P_w)}, \quad Y_1 = \frac{(I_w - I_o)}{2(P_w - P_o)} - \frac{(I_o + I_w)}{2(P_w + P_o)} \tag{48}$$

$$(I_o + I_w) = qDA(P_o + P_w)\left(\frac{\cosh\frac{W}{L} - 1}{\sinh\frac{W}{L}}\right)$$
$$+ \frac{qDA\tau s}{2L\sinh\frac{W}{L}}(P_o + P_w)\left(\frac{\cosh\frac{W}{L} - 1}{\sinh\frac{W}{L}}\right)\left(\frac{W}{L} + \sinh\frac{W}{L}\right) \tag{49}$$

$$(I_w - I_o) = -qDA(P_o - P_w)\left(\frac{\cosh\frac{W}{L} + 1}{\sinh\frac{W}{L}}\right)$$
$$+ \frac{qDA\tau s}{2L\sinh\frac{W}{L}}(P_o - P_w)\left(\frac{\cosh\frac{W}{L} + 1}{\sinh\frac{W}{L}}\right)\left(\frac{W}{L} - \sinh\frac{W}{L}\right) \tag{50}$$

$$Y_2 = \frac{qDA}{L}\left(\frac{\cosh\frac{W}{L} - 1}{\sinh\frac{W}{L}}\right)\left(1 + \frac{\tau s}{2\sinh\frac{W}{L}}\left(\frac{W}{L} + \sinh\frac{W}{L}\right)\right) \tag{51}$$

$$Y_1 = \frac{qDA}{L}\left(\frac{1}{\sinh\frac{W}{L}}\right)\left(1 + \frac{\tau s}{2\sinh\frac{W}{L}}\left(\sinh\frac{W}{L} - \frac{W}{L}\cosh\frac{W}{L}\right)\right) \tag{52}$$

FIG. 10I $$I = \frac{V}{R} + C\frac{dV}{dt} = \left(\frac{1}{R} + Cs\right)V \qquad (53)$$

$$C_1 = \frac{qDA}{L}\left(\frac{T}{2(\sinh\frac{w}{L})^2}\left(\sinh\frac{w}{L} - \frac{w}{L}\cosh\frac{w}{L}\right)\right) \qquad (54)$$

$$R_1 = \frac{L}{qDA}\sinh\frac{w}{L} \qquad (55)$$

$$C_2 = \frac{qDA}{L}\left(\frac{\cosh\frac{w}{L} - 1}{\sinh\frac{w}{L}}\right)\frac{T}{2\sinh\frac{w}{L}}\left(\frac{w}{L} + \sinh\frac{w}{L}\right) \qquad (56)$$

$$R_2 = \frac{L}{qDA}\left(\frac{\sinh\frac{w}{L}}{\cosh\frac{w}{L} - 1}\right) \qquad (57)$$

$$I_x(t) = \frac{(qDA\pi)}{w} \cdot (K_1 + 2K_2 + 3K_3) \qquad (58)$$

$$I_y(t) = \frac{(qDA\pi)}{w} \cdot (K_1 - 2K_2 + 3K_3) \qquad (59)$$

$$I_1(t) = \frac{(qDA\pi)}{w} \cdot (2K_2) \qquad (60)$$

$$I_2(t) = \frac{(qDA\pi)}{w} \cdot (K_1 + 3K_3) \qquad (61)$$

FIG. 10J $$Q_i = Q_0 + Q_{qtl} + \sum_{n=1, n\,odd}^{\infty} Q_n \qquad (62)$$

$$Q_0 = qA \int_0^w \left( P_0 \left( \frac{\sinh\frac{(w-x)}{L}}{\sinh(\frac{w}{L})} \right) + P_w \left( \frac{\sinh\frac{(x)}{L}}{\sinh(\frac{w}{L})} \right) \right) dx$$

$$= qAL(P_0 + P_w) \left( \frac{\cosh(\frac{w}{L}) - 1}{\sinh(\frac{w}{L})} \right) \qquad (63)$$

$$Q_{qtl} = \frac{qAw\tau}{2} \left( \frac{\cosh(\frac{w}{L}) - 1}{\sinh(\frac{w}{L})} \right) \left( \frac{L}{w} - \frac{1}{\sinh(\frac{w}{L})} \right) (-m_o - m_w) \qquad (64)$$

$$Q_n = qA \int_0^w K_n \sin(\frac{n\pi x}{w}) dx$$

$$= \frac{qAw}{n\pi} K_n (1 - (-1)^n) \qquad (65)$$

$$\frac{dQ_n}{dt} + \frac{Q_n}{\tau_n} = \frac{-8L^2 \tau_n^2}{w^2 \tau^2} \frac{dQ_{qtl}}{dt} \left( \frac{\sinh(w/L)}{(\cosh(w/L) - 1)\left( \frac{L}{w} - \frac{1}{\sinh(w/L)} \right)} \right) \qquad (66)$$

$$I_i = I_0 - I_w = qAD \left( \frac{dP}{dx}\bigg|_{x=0} - \frac{dP}{dx}\bigg|_{x=w} \right)$$

$$= \frac{1}{\tau} \left( Q_0 - Q_{qtl} \frac{\left( \frac{L}{w} + \frac{1}{\sinh(w/L)} \right)}{\left( \frac{L}{w} - \frac{1}{\sinh(w/L)} \right)} - \sum_{n=1, n\,odd}^{\infty} Q_n \left( \frac{n\pi L}{w} \right)^2 \right) \qquad (67)$$

FIG. 10K

METHOD FOR SIMULATING DISTRIBUTED EFFECTS WITHIN A DEVICE SUCH AS A POWER SEMICONDUCTOR DEVICE

DESCRIPTION

This invention relates to a method for simulating time dependent characteristics of a device such as a power semiconductor device to enable the operation of that device to be determined and more particularly, but not exclusively, to a method for generating a simulation program for automatically simulating such time dependent characteristics to enable the operation of the device within a larger circuit to be simulated by a circuit simulator program Computer aided circuit design using circuit simulators such as SPICE which was developed at the University of California, Berkeley and is described in their Electronics Research Laboratory Reports No. ERL-M520 by L. W. Nagel in a paper entitled "a computer program to simulate semiconductor circuits" is well established for circuit products which use digital or small signal components. Such simulators use a library of computer models, often called compact models, to reproduce the electrical behaviour of the components being used to form the circuit and there are text books available, for example "Semiconductor Modelling with SPICE" edited by Paolo Antognetti and Guiseppe Massobbrio and published by McGraw-Hill, which describe various such compact models for determining, given measured parameters, the characteristics of circuit components such as diodes, transistors etc.

The use of computer aided design (CAD) is particularly beneficial to circuit designers because it allows the performance of a circuit to be predicted without having to make a prototype circuit and more importantly it allows the effect of changes on the circuit design to be studied easily so allowing a particular circuit to be optimised for several different uses without having to build and test numerous prototypes. Thus, a wide range of different circuit configurations can be studied, the particular components used can be varied systematically to achieve a desired performance, for example desired gain, distortion or cross-talk characteristics, and also variations between components arising from the manufacturing process can be taken into account and the circuit optimised to maximise yield.

In all classical physical systems (for example, semiconductor devices) the variables which describe the behaviour of the system, for example, the mobile carrier density, temperature etc, are continuous in space. Even though the physical system may interact with its surroundings, for example, the rest of an electrical circuit, only at discrete points in space, namely the electrodes or terminals of a semiconductor device, the behaviour at these discrete points is nevertheless determined by continuous variables at all points in between, that is within the device in the case of a semiconductor device. Numerical techniques for coping with this situation are well developed: the spatial extent of the physical system can be split into a large number of much smaller sections by defining a mesh of discretisation points. The values of each variable can then be calculated at all the mesh points using the boundary conditions at the points of interaction and known differential equations describing the spatial and temporal behaviour of the variables. In this way, effects which are distributed between these points of interaction are reduced to purely local effects through the definition of an array of mesh points in space. Unfortunately, it is not possible to use such numerical techniques in a circuit simulator. Such simulators are intended to simulate the interaction between devices at the component level but have no capability to predict such distributed effects occurring within the device or component. This is because circuit simulators have a temporal variable but no spatial variable so that the discretisation in space described above is not possible. Thus, compact models define discrete components, such as diodes, in terms of analytic equations which relate the currents and voltages at the terminals of the device. Existing compact models do not, therefore, cope well with switching or transient characteristics which arise, for example, when a power semiconductor device is switched rapidly. Thus, although such compact models can deal satisfactorily with small signal devices, they do not reproduce correctly the characteristics of power devices in which large overshoots of current or voltage may occur which might damage other components in the circuit being designed. In particular, because existing compact models are based on the so-called quasi-static approach which assumes that the current flow through a component and the charge stored in the component are instantaneous functions of voltages applied to the terminals of the component and ignores distributed effects, existing compact models do not cope well with components such as power bipolar transistors, Insulated Gate Bipolar Transistors (IGBTs) and pn junction diodes which incorporate diode structures including a relatively thick relatively lightly doped region whose conductivity is modulated as a result of injected plasma during the on-state of the component.

The circuit designer thus has need of a compact model which can be introduced into a circuit simulator and which provides a reliable way of predicting distributed effects within devices such as power Semiconductor devices incorporating diode structures, for example pn junction diodes, bipolar junction transistors and IGBTs.

According to one aspect of the present invention, there is provided a method for simulating time dependent characteristics of a device to enable the operation of that device to be determined, which method comprises solving the time-dependent differential equation using boundary conditions which define the time dependent characteristics as evolving at a constant rate for a given time interval such that only a small number of transient terms are required for the solution, devising a model for the device using the solution of the time dependent differential equation determined using those boundary conditions and using the model to determine the time dependent characteristics of the device.

The present invention also provides a computer system storing a simulation program for simulating time dependent characteristics of a device to enable the operation of the device within a larger circuit to be simulated by a circuit simulator program containing a computer model of the device to facilitate the designing of circuits incorporating such a device, which computer system comprises means for solving a time dependent differential equation using boundary conditions which define the time dependent characteristics as evolving at a constant rate for a given time interval such that only a small number of transient terms are required for the solution and means for using the solution of the time dependent differential equation to modify the computer model of the device contained within the simulator program to enable the time dependent characteristics of the device to be simulated.

In another aspect of the invention, there is provided a method for generating a simulation program for automatically simulating time dependent characteristics of a device to enable the operation of the device within a larger circuit to be simulated by a circuit simulator program which contains a computer model of the device to facilitate the designing of circuits incorporating such a device, which method comprises using a computer system to solve a time dependent differential equation using boundary conditions which define the time dependent characteristics as evolving at a constant rate for a given time interval such that only a small number of transient terms are required for the solution and using the solution of the time dependent differential equation to modify the computer model of the device contained within the simulator program to enable the time dependent characteristics of the device to be simulated.

Such a method enables the distributed effects of a device to be simulated in a circuit simulation.

The device may comprise a semiconductor device comprising a diode structure having a semiconductor region which is relatively lowly doped and undepleted in operation of the device by using the computer system to solve the time-dependent diffusion equation by defining the minority charge carrier density conditions at the boundaries of the semiconductor region as evolving at a constant rate for a given time interval to provide a solution of the time-dependent diffusion equation having a first component representing a steady state part of the relationship between the current flow and the minority carrier densities at the boundaries of the semiconductor region, a second component representing a time varying part of the relationship between the current flow and the minority carrier densities at the boundaries of the semiconductor region under conditions in which the rate of change of the boundary values is constant for a given time interval and a third component for representing a series transient terms which decay with time, the boundary conditions being such that only a first few of the series of transient terms are required for the solution.

The first, second and third components of the time-dependent diffusion equation within the simulation program may be represented as a circuit comprising respective first, second and third circuit elements representing, respectively, the first, second and third components and providing within the simulation program input and output current source components for reproducing the influence of current flow through the semiconductor device and or recombination and input and output voltages for reproducing the minority carrier densities.

The first, second and third circuit elements may comprise a resistor, capacitor and a current source. In one example, the circuit may comprise a π network in which each arm of the π contains a parallel combination of a resistor, a capacitor and a current source having values determined by the given parameters.

The value of each current source within the circuit, and thus the transient terms, may be determined using a respective subsidiary circuit comprising a parallel combination of a resistor, a capacitor and a current source.

The device may be provided as a semiconductor diode which may be modelled by the circuit simulator as a non-linear resistor which sits between the anode and cathode of the diode with the simulation of the circuit simulator being modified by the model for the distributed effects (that is for modelling the physics within the diode) which, as indicated above, may comprise a parallel combination comprising a π network in which arms of the π contain a parallel combination of a resistor, a capacitor and a current source.

Generally, only the first three, or perhaps five, transient terms need be used. The rate of change of the distributed effect or boundary minority carrier density may be changed after the given time interval so that the rate of change is constant but different in the given time interval and in a further succeeding similar time interval.

The transient terms may be simulated by a subsidiary circuit comprising a parallel combination of a resistor, a capacitor and a current source. Generally, a respective such subsidiary circuit is required to simulate each transient term, that is three subsidiary circuits where three transient terms are used. Where the solution of the time-dependent diffusion equation is represented within the simulation program as a circuit comprising a parallel combination of a resistor, capacitor and a current source, for example the π network mentioned above, then the subsidiary circuits may be used to determine the value of each current source within the circuit.

Where the circuit simulator allows the direct input of differential equations without the need for conversion to a circuit model then, as an alternative to the above, the solution of the time-dependent diffusion equation may be represented within the simulation program as respective charges stored within the diode structure for the first, second and third parts of the solution, and a recombination current.

The inventor has thus found that, by making certain novel approximations in the boundary conditions used to solve the time-dependent differential equations which describe the above-mentioned distributed effects, namely by assuming that physical quantities such as carrier density, depletion layer width etc. at the boundaries alter in steps such that, with each step, the rate of change of these physical quantities, rather than the quantity itself, changes, the distributed effects can be modelled in terms of a so-called time-linear component associated with the instantaneous rate of change of the aforementioned physical quantity and an infinite sum of decaying terms whose relative amplitudes decrease in such a way that only the first few such terms are required to enable the switching characteristics of the component to be determined satisfactorily. This simplifies the model and moreover reduces the computer processing time required to determine the characteristics.

As one example of the use of these novel approximations, the inventor has determined the appropriate model for a power or p-i-n diode. In this case, the differential equation is the ambipolar diffusion equation, the distributed effects of interest are associated with the storage and removal of minority charge carriers from the relatively thick, lightly doped region (i-region) and the physical quantities of relevance are the width of the depletion region at the p-i junction and the values of the minority carrier density at the boundaries of the undepleted (that is not depleted of free charge carriers) i-region. It has been shown that the appropriate circuit for such a diode comprises a non-linear resistor whose voltage is related to the current flow using analytic expressions in terms of the aforementioned boundary conditions for the minority carrier density, which are, in turn, related to the current flowing through the non-linear resistor in a manner determined by the ambipolar diffusion equation. The inventor has provided a means of deriving these boundary values using the novel approximation described above. As one example, diffusion of minority carriers across the undepleted i-region may be modelled using a "π" network in which arms of the π contains a parallel combination of a resistor, a capacitor and a current source. The values of these components are determined by parameters which characterise the device, of which the diode area, the i-region width, doping level and carrier lifetime are the most important. The resistive elements in the arms of the π network reproduce the d.c. relation between the current flow and the boundary minority carrier densities. The capacitive elements in each arm of the π network reproduce the transient relationship between the current flow and the boundary minority carrier densities under conditions in which the rate of change of these boundary values is constant. The current sources in the π network represent a corrective term determined entirely by the amplitudes of the decaying terms which are, in turn, determined by the extent to which the time dependence of these boundary values has departed from being a constant at all previous times. Current sources at the input and output reproduce the influence of current flow through the device and recombination in the contact regions while the input and output voltages reproduce the boundary minority carrier densities. In many circumstances, the use of only three decaying terms is sufficient to provide accurate results.

Embodiments of the invention will now be described, by way of example, with reference to the accompanying drawings, in which:

FIG. 8a illustrates schematically a circuit model for a diode such as the diode shown in FIG. 1 while

Figure 11:
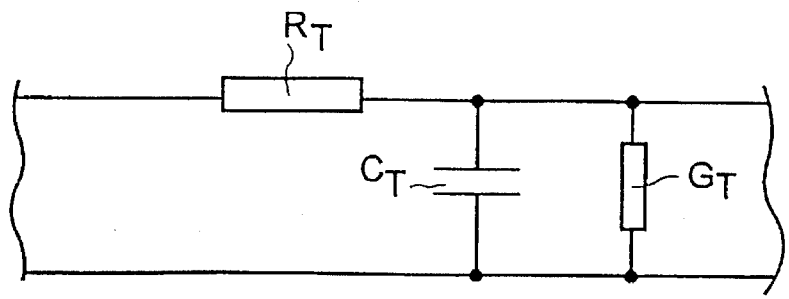

FIG. 10 (in the form of FIGS. 10A to 10K) illustrates equations for explaining methods in accordance with the invention;

FIG. 11 shows one of a number of repeating units of a transmission line; and

Figure 12:
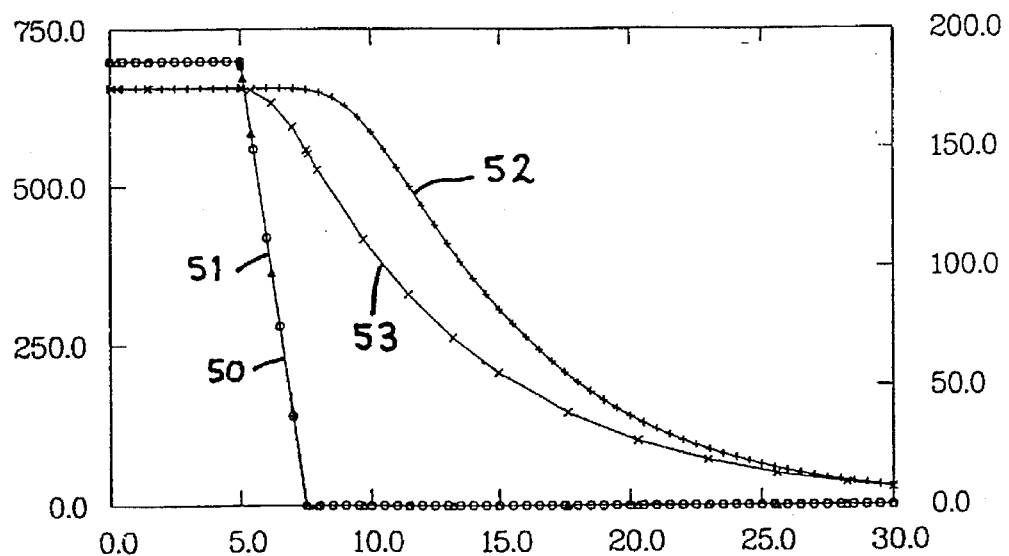
Figure 13:
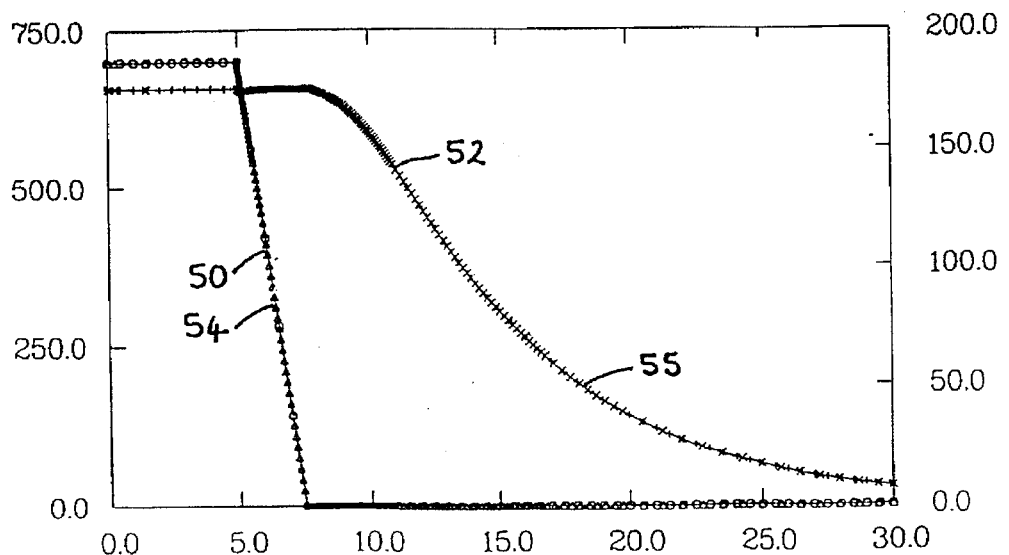

FIGS. 12 and 13 are comparative graphs for showing the effect of a method in accordance with the invention in simulating a transmission line formed of repeating units of the type shown in FIG. 11.

Figure 1:
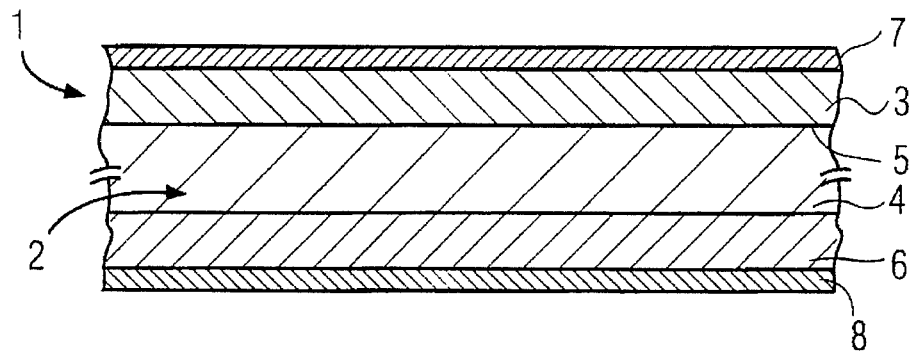
FIG. 1 shows a schematic cross-sectional view of a p-i-n junction diode.

Referring now to the drawings, FIG. 1 illustrates a cross-sectional view through a typical pn junction diode 1. In this example, the diode 1 comprises a monocrystalline silicon semiconductor body 2 into which dopants have been introduced using conventional techniques to define a relatively highly doped p+ conductivity anode or first region 3, a relatively lowly doped n– conductivity or second region 4 defining a pi junction 5 with the anode region 3 and a relatively highly doped n+ cathode or third region 6. Anode and cathode electrodes 7 and 8 make ohmic contact with the anode and cathode regions 3 and 6, respectively.

Figure 2:
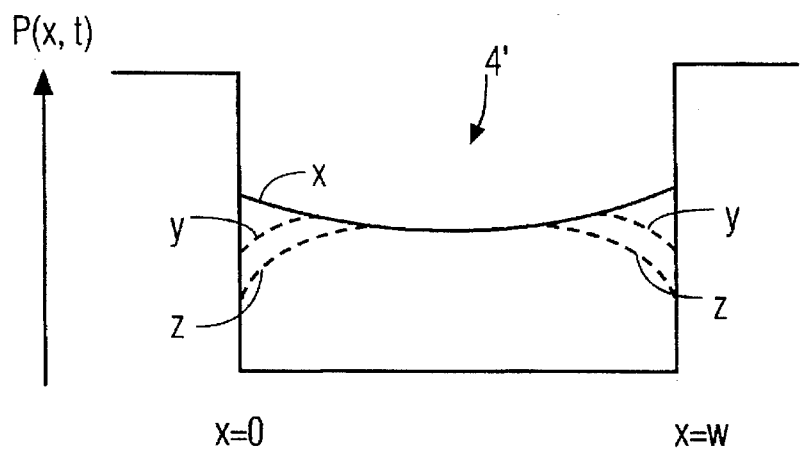
FIG. 2 illustrates schematically by way of a graphical representation the extraction of charge during switching off of a p-i-n junction diode such as that shown in FIG. 1.

In operation of the diode 1 shown in FIG. 1, when a voltage is applied across the anode and cathode electrodes 7 and 8 so as to forward bias the pn junction 5, holes are injected into the second region 4 from the anode region 3 and electrons are injected into the second region 4 from the cathode region 6 so that a current flows through the diode between the anode and cathode electrodes 7 and 8. The conductivity of the second region 4 is thus modulated by the injected electron and hole plasma. Accordingly, when the diode is subsequently switched off by the removal of the forward-biassing voltage across the anode and cathode electrodes 7 and 8, the current flow and charge stored in the diode do not change instantly because it is necessary for the plasma stored in the undepleted part 4' of the second region 4 to be extracted via the anode and cathode electrodes 7 and 8 or to be removed by recombination. The changes in the current flow and charge stored in the diode are thus distributed in time and space (ie within the diode semiconductor structure). Thus the switching characteristics of the diode are to a large extent determined by the distributed effects due to for example diffusion of charge carriers within the second region 4. FIG. 2 shows very schematically the type of change occurring in the undepleted part 4' of the second region 4. The solid line X in FIG. 2 represents the overall charge stored in the second region 4 just before the diode is switched off while the dashed lines Y and Z illustrate the situation at respective subsequent times following the switching off of the diode 1. P is the minority carrier density within the second region 4.

The inventor has found that, by making certain novel approximations in the boundary conditions used to solve the time-dependent differential equations which describe distributed effects, such as switching characteristics in a diode like that shown in FIG. 1, namely by assuming that physical quantities such as carrier density, depletion layer width etc. at the boundaries alter in steps such that, with each step, the rate of change of these physical quantities (rather than the quantity itself) changes, the distributed effects can be modelled in terms of a so-called time-linear component associated with the instantaneous rate of change of the aforementioned physical quantity and an infinite sum of decaying terms whose relative amplitudes decrease in such a way that only the first few such terms are required to enable the switching characteristics of the component to be determined satisfactorily. This simplifies the circuit model and moreover reduces the computer processing time required to determine the characteristics.

As an example of the use of these novel approximations, the inventor has determined the appropriate model for determining the distributed effects, that is for modelling the physics within the diode, of a power or p-i-n diode of the type shown in FIG. 1 which may be represented in a circuit simulator as a circuit model by a non-linear resistor 30 shown in FIG. 8b as will be described below. In this case, the differential equation is the ambipolar diffusion equation, the distributed effects of interest are associated with the storage and removal of minority charge carriers from the relatively thick, lightly doped second region 4 and the physical quantities of relevance are the width of the depletion region at the p-i junction 5 and the values of the minority carrier density P at the boundaries of the undepleted i-region 4. Equation 1 in FIG. 10 is the time-dependent ambipolar diffusion equation in which P(x,t) is the plasma density, effectively minority carrier density, at a point x between the opposite ends x=0 and x=w of the undepleted part 4' of the second region 4, L is the diffusion length and D is the diffusion coefficient.

In this example, initially the boundary conditions P(0,t) and P(x,t) are selected, as shown in equation 2 in FIG. 10, such that each is given by the minority carrier density $p_o$ and $p_w$, respectively, at a selected time t=0 plus t times a fixed rate of change of minority carrier density with time, namely $m_o$ and $m_w$, respectively, where $p_o$, $p_w$, $m_o$ and $m_w$ have the values given in equation 3 in FIG. 10. It should be understood that when the terms $P_0$ and $P_w$ (that is where an upper case letter P is followed simply by the subscript 0 or w) are used within the following text or Figures this is simply a more convenient way of writing P(0, t) and P(w, t), respectively.

Any appropriate well-known mathematical technique, such as Laplace or Fourier transforms, may be used to solve equation 1 giving equation 23 in FIG. 10 in which the first two terms 23i represent the dc or steady state solution, the second two terms 23ii represent the quasi time-linear solution, that is the component which varies linearly with time, and the last term 23iii is a Fourier series which represents the above-mentioned sum of decaying or transient terms.

One possible method of solving equation 1 to obtain equation 28 using Laplace transforms will now be explained with the help of FIG. 10, in particular equations 4 to 29 of FIG. 10.

In the example shown in FIG. 10, equation 1 is first Laplace transformed to give equation 4. As the actual initial conditions are not relevant to the problem, the final term of equation 4 will be ignored and the remaining part can be represented as shown in equation 4a with the lifetime $\tau=L^2/D$. The boundary conditions given by equation 2 are also Laplace transformed as shown by equation 5 in FIG. 10. It is well known that equations of the form of equation 4 have a solution of the form shown in equation 6 where A and B are to be determined and $\alpha$ has the value given in equation 6. Equation 6 is then solved for A and B by using the boundary conditions given by equation 5 as shown by equation 7 in FIG. 10. Substituting the values for A and B in equation 6 gives equation 8. It is now necessary to find the inverse Laplace transform of equation 8. The inverse Laplace transform of the second term of equation 8 is given by equation 9 in FIG. 10. Solving the integral gives the solution shown in equation 10 in FIG. 10. By analogy, the inverse Laplace transform of the first term of equation 8 is as shown in equation 11 in FIG. 10 and the full solution can be written as shown by equation 12 in FIG. 10.

The solution given by equation 12 needs to be converted to a closed form. It is known that sinh(ax) equals the sum given in equation 13 in FIG. 10 and, by an appropriate change of variables as shown in equation 14 in FIG. 10, equation 13 can be rewritten in a form which looks like that of the first term of equation 8 (that is the term in $\tau_n$) as indicated by equations 15 and 16. Thus, the first term of equation 12 is equivalent to the closed form shown in equation 17 of FIG. 10.

The functional form of the second term of equation 12 is that given by equation 18 in FIG. 10. The Fourier series for g(x) is given by equation 19 in FIG. 10 assuming periodicity between x=-w and w and that g(-x)=-g(x) which is acceptable because g(x) is only defined from x=0 to x=w. The Fourier series g(w-x) is, by analogy, that given in equation 19 where $b_n$ and $b'_n$ are represented by the expressions given in equation 19 and where, as can be shown by reference to an appropriate standard integral reference work such as Mathematica, $b_n$ is equivalent to the expression given in equation 20 in FIG. 10. Substituting for g(x) and g(w-x) in equation 18 gives equation 21 in FIG. 10 so that the second term of equation 12 takes the form shown in equation 22 in FIG. 10. The full closed form of equation 12 is thus given by equation 23 in FIG. 10 plus the term shown in equation 24 in FIG. 10. However, if the initial conditions had been applied correctly, that is if the final term of equation 4 had not been ignored, the term given in equation 24 would disappear.

Accordingly, the actual full closed solution is that given in equation 23 in which, as indicated above, the first two terms 23i represent the steady state solution, the second two terms 23ii represent the time-linear solution and the last term 23iii is a Fourier series which represents the above-mentioned sum of transient or decaying terms which die out as t tends to infinity. At t=o, P(x,t)=0 because of the boundary conditions. Hence some transients are associated with the step in $p_o$ and $p_w$ at the respective boundaries and some with the change in slope $m_o$ and $m_w$.

In the present example, the Fourier series 23iii in the final term of equation 23 is now truncated at the third term to become equation 25 in FIG. 10. In equation 25, $K_1$, $K_2$ and $K_3$ are coefficients with $K_n$ being given by equation 26 in FIG. 10.

Figure 3:
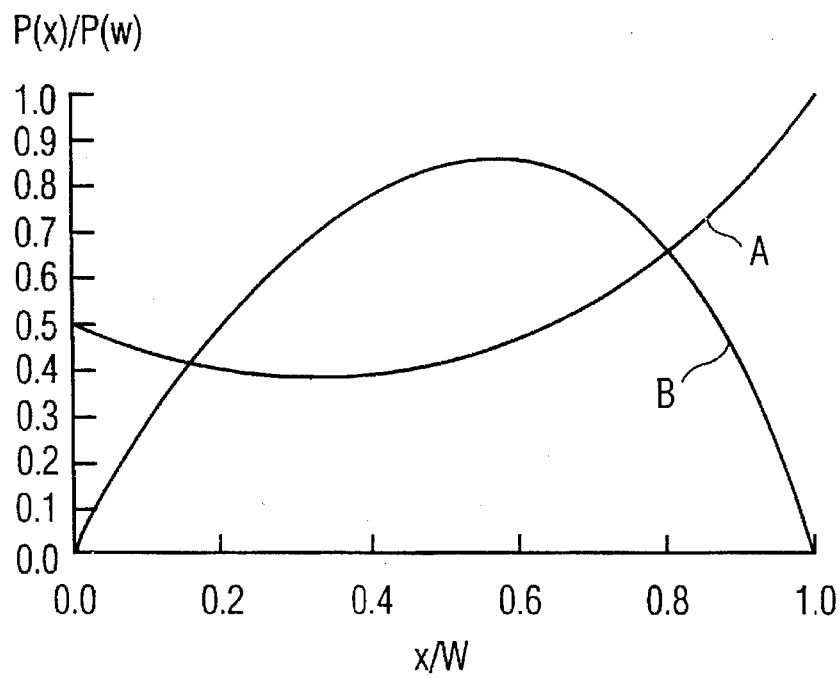
FIGS. 3 to 5 illustrate graphically the simulated minority carrier charge density distribution (P(x,t)/P(w,t)) between the boundaries x=0 and x=w of the undepleted lightly doped region of a diode such as that shown in FIG. 1.
Figure 4:
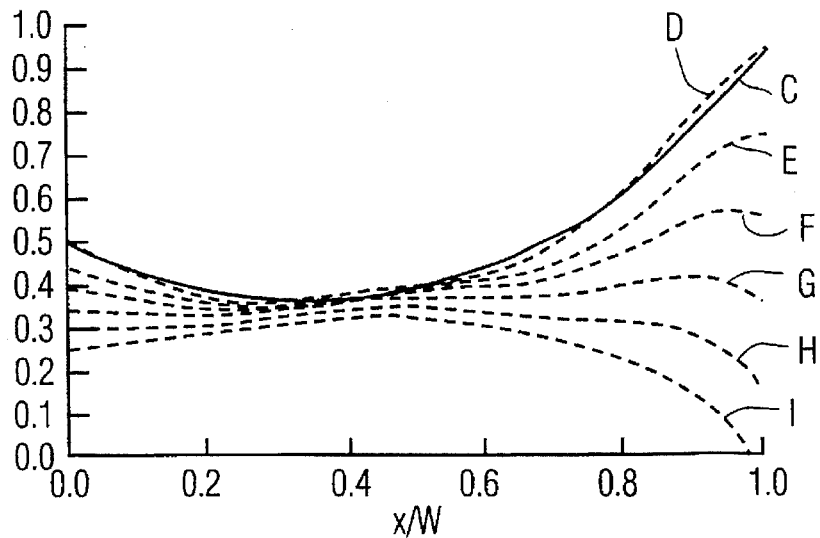
Figure 5:
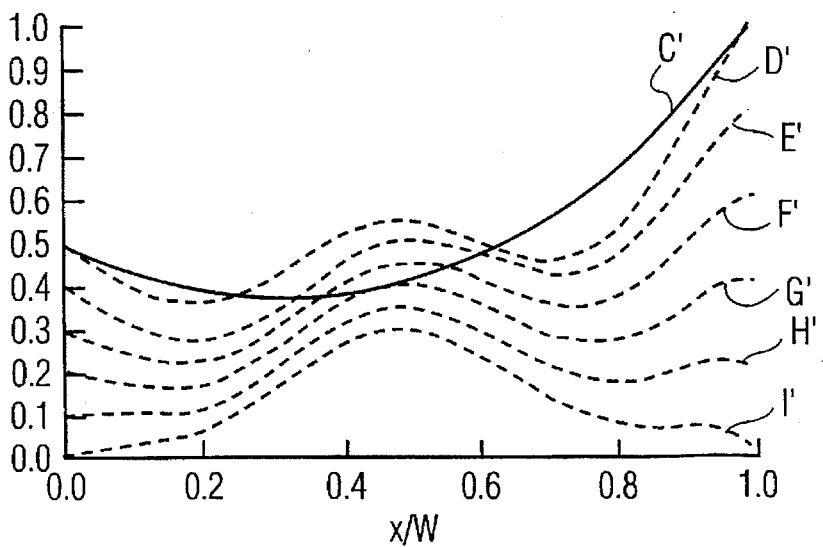

As an example, consider the case where (with the minority carrier densities normalised by a suitable factor; in this case the minority carrier density in the second or i-region divided by 100):

$p_w/100N_D=1$, $p_o/100N_D=0.5$, $\tau=10^{-6}$s, $w/L=10^{-2}$cm/$\sqrt{D\tau}=10^{-2}/\sqrt{17\tau}$, $m_w/100N_D=-4\times10^6$s$^{-1}$ and $m_o/100N_D=-10^6$s$^{-1}$ For these values, FIGS. 3 to 5 give the steady state 23i, the time linear 23ii and then the full solution 23 for P(x,t) with just three Fourier terms. FIG. 3 shows by way of the curve A the nature of the steady state term 23i of equation 23 and by way of curve B the nature of the time-linear component 23ii of equation 23 while FIG. 4 shows by way of the solid line C the initial starting state of P(x,t<0), by way of the first dashed line D the full solution at t=0 and by way of the further dashed lines E to I the solution at times t equal to 0.5, 1.0, 1.5, 2.0 and 2.5×10$^{-7}$ seconds, respectively. Curve D differs from curve C only as a result of the fact that the Fourier series has been truncated, in this case at the third term.

Figure 6:
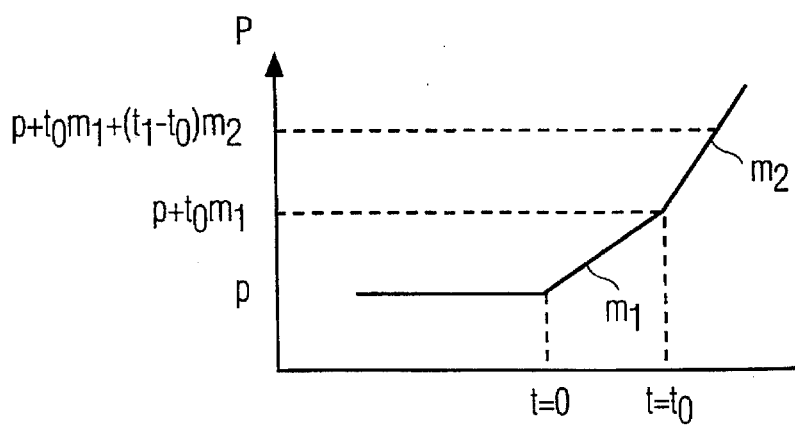
FIG. 6 is a simple diagram for assistance in explaining a method in accordance with the invention.

If, however, $K_1$, $K_2$ and $K_3$ are calculated to ensure that, at t=0, the stored charge and the currents at x=0 and x=w are continuous, that is complying with equation 27 in FIG. 10, then $K_1$, $K_2$ and $K_3$ have the values given in equations 28, 29 and 30, respectively, in FIG. 10 and different results are achieved as shown in FIG. 5 in which the curves C' to I' correspond to the curves C to I in FIGS. 3 and 4, In accordance with the invention, it is the change in the rate of change of the minority carrier density rather than the actual change in the minority carrier density which is to be considered in order to enable prediction of distributed effects in a device; in this example the switching characteristics of a diode. FIG. 6 illustrates this schematically by showing a particular change in the rate of change of the minority carrier density, $m_o$ or $m_w$ for either or both of the ends x=0 and x=w of the undepleted part 4' of the second region 4. In particular, FIG. 6 shows P(x,t) or P(w,t) (the subscripts o and w are omitted in the following and in FIG. 6 as the expressions could apply to either end of the undepleted part 4') changing from p to p+$m_1$ t at t=0 and then to p+$m_1 t_0$+$m_2(t-t_0)$ at t=$t_0$, where $m_1$ and $m_2$ represent, respectively, first and second different values of m.

The solution of equation 1 for these boundary conditions from t=0 to t=$t_0$ is given by equation 23 for which Fourier series of the final term 23iii can be rewritten as shown in equation 31 in FIG. 10 with the term shown in equation 32 being the nth Fourier coefficient with the time dependence written explicitly.

At a time $t_x$ just before $t_0$, then P(x, $t_x$) is given by equation 33 in FIG. 10 while at a time $t_y$ just after $t_0$, P(x, $t_y$) is given by equation 34 in FIG. 10 where $C_n$ are chosen to ensure that P(x, $t_x$)=P(x, $t_y$), that is as indicated in equation 35 in FIG.

10. Letting $t_0$ tend to zero in equation 35 gives equation 36 which leads to equation 37 and then equation 38 in FIG. 10.

Figure 7:
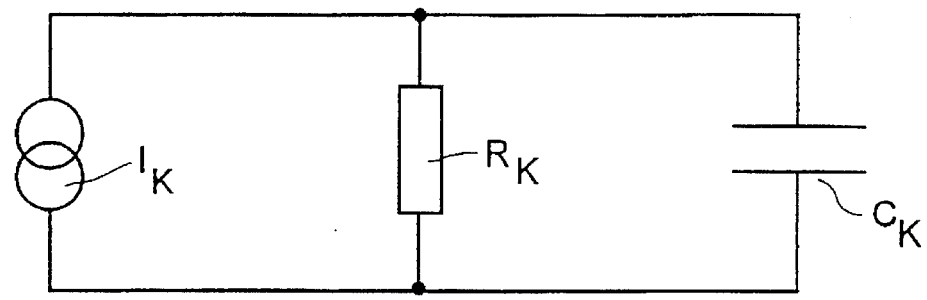
FIG. 7 illustrates a circuit for determining the transient components of the switching characteristics of a diode such as that shown in FIG. 1.

The fact that, in the limit as $t_0$ tends to zero, $B_n$ tends to $K_n$, means that the expression given in equation 38 is that required to obtain the values of $K_n$. Although using some circuit simulators it may be possible simply to write or add the equation 38 into the simulator program or software, where a simulator such as PSTAR is used then it is necessary to represent equation 43 as a circuit model. FIG. 7 shows a parallel combination of a capacitor $C_k$, a resistor $R_k$ and a current source $I_k(t)$ that can be used to represent equation 38 with the values of the capacitor $C_k$, resistor $R_k$ and current source $I_k(t)$ being chosen, as indicated in equation 39 in FIG. 10 so that equation 40 fits the differential equation 38.

FIG. 7 thus represents a circuit which may be used to obtain $K_n$. A respective circuit of the type shown in FIG. 7 is required to determine each of the coefficients $K_n$. The values of the respective resistive, capacitive and current source components $R_k$, $C_k$ and $I_k(t)$ are at least partly determined by the known or measured parameters of the diode and may be already provided by the current simulator.

Figure 8A:
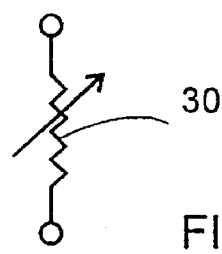

It has been shown previously that the appropriate circuit model (for use in a circuit simulator) for a diode such as that shown in FIG. 1 comprises a non-linear resistor such as the resistor 30 shown in FIG. 8a whose voltage is related to the current flow in accordance with the analytic expression given in equation 41 in FIG. 10 where q is the electronic charge, $N_D$ and $N_A$ are the dopant densities in the N and P contact regions 6 and 3, $N_{Di}$ is the dopant density in the i-region 4, $V_i$ is the voltage across the i-region 4 and I is the current flowing through the diode (and thus through the non-linear resistor 30 representing the diode). The current I is, by virtue of conductivity modulation, a function of P(0, t) and P(w,t).

Figure 8B:
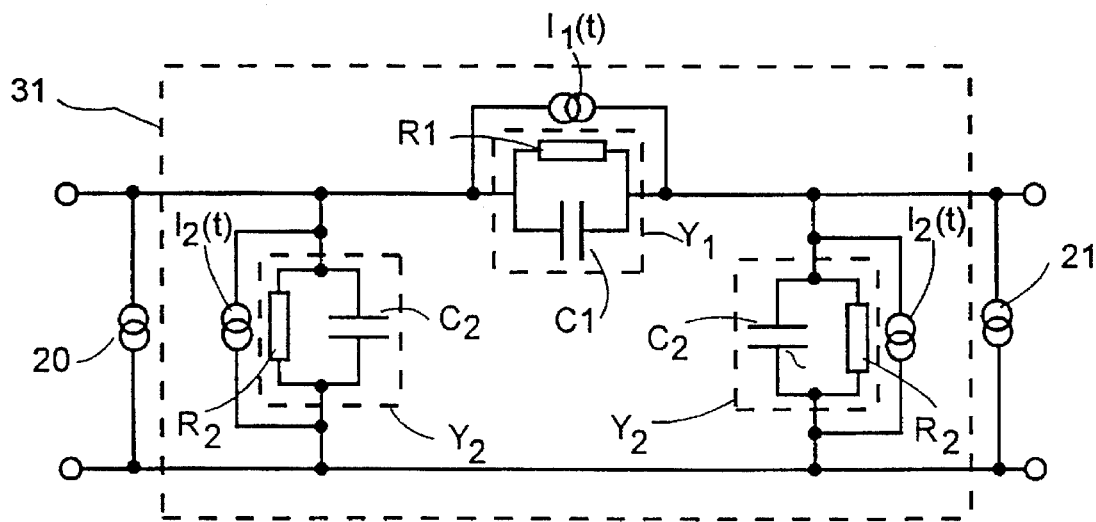
FIG. 8b shows an auxiliary circuit for determining the distributed effects using the circuit shown in FIG. 7.

The physics within the i-region 4 is determined by the ambipolar diffusion equation 1 and thus by equation 23 which in this example is represented as shown in FIG. 8b as a π network of impedances $Y_1$ and $Y_2$ comprising a parallel combination of a capacitor $C_1$ and a resistor $R_1$ and a parallel combination of a capacitor $C_2$ and a resistor $R_2$ respectively. As will be explained later, a current source $I_1(t)$ is provided in parallel with the impedance $Y_1$ and a current source $I_2(t)$, is provided in parallel with each impedance $Y_2$ to represent the transient or Fourier terms (23iii in equation 23). The remainder of the π network (that is the impedances $Y_1$ and $Y_2$ without the current sources $I_1(t)$ and $I_2(t)$) represents the steady state or dc and quasi time linear terms.

The circuit shown in FIG. 8b determines P(0, t) and P(w, t) as a function of I so that V(t) is a function only of I(t).

The effect of recombination in the contact regions 3 and 6 is taken into account by considering the current through the device, including the recombination currents, as a function of P(0, t) and P(w, t). In this way, the hole current $I_p$ at the p contact region 3 and the electron current $I_n$ at the n contact region 6 can be determined and are in the form shown in equation 42 in FIG. 10, where $I_D$ is the current flowing through the device, b is a proportioning parameter and h and s are model parameters that describe the recombination of charge in the contact regions 3 and 6. As a result, the i-region 4 behaves as if it has two current sources (shown as 20 and 21 in FIG. 8b) extracting or injecting charge into the i-region 4. These current sources 20 and 21 are, as shown in equation 42 in FIG. 10, a function of $I_D$, P(0, t) and P(w, t).

The complete diode model thus consists of, in this case, the non-linear resistor 30, the π network 31 and the first and second current sources 20 and 21 which represent the effect on the i-region 4 of the current flow through the diode that does not recombine in a contact region 3 or 6 between the i-region 4 and the associated electrode 7 or 8.

Converting the above to this circuit model gives $I_0$ and $I_w$ as indicated by equation 43 in FIG. 10 (with A being the area of the diode) so that $I_0$ can be expressed as shown in equation 44 and $I_w$ as shown in equation 45 in FIG. 10.

Now $Y_1$ and $Y_2$ can be determined in terms of $I_D$, $I_o$, $I_w$ and P(0,t) and P(w,t) as shown by equations 46 to 48 in FIG. 10 where $I_{Y1}$ is the current through the impedance $Y_1$.

Ignoring, for convenience and simplicity, the Fourier Terms to start with and taking the Laplace Transform gives $I_o+I_w$ and $I_w-I_o$ as shown by equations 49 and 50, respectively, in FIG. 10 so that $Y_1$ and $Y_2$ are given by equations 51 and 52, respectively, in FIG. 10.

Thus impedances $Y_1$ and $Y_2$ are of the form a+bs and may, as will now be shown, each be represented by a parallel resistor-capacitor (RC) circuit. The total current I through any general parallel RC circuit is given by equation 53 in FIG. 10 in which C and R are the capacitance and resistance of the parallel RC circuit and V is the voltage across the general parallel RC circuit. Thus, impedances $Y_1$ and $Y_2$ may be represented by respective parallel RC circuits in which the capacitive term $C_1$ of $Y_1$ is given by equation 54 and the resistive term $R_1$ of $Y_1$ is given by equation 55 while the capacitive term $C_2$ of $Y_2$ is given by equation 56 and the resistive term $R_2$ of $Y_2$ is given by equation 57.

The influence of the Fourier terms can now be added back again as current sources adding directly to $I_0$ and $I_w$. In this example where the Fourier series has been truncated at the first three terms, the value of the current source adding to $I_0$ would be given by equation 58 in FIG. 10 and the value of the other current source adding to $I_w$ would be given by equation 59 in FIG. 10. The network may however be made symmetrical (as shown in FIG. 8) by incorporating a current source in parallel with each impedance with the current source $I_1(t)$ in parallel with the impedance $Y_1$ representing the effective flow of current, as given by equation 60 in FIG. 10, between the two impedances $Y_2$ so that the current sources $I_2(t)$ in parallel with the impedances $Y_2$ are of equal value, and are as shown in equation 61 in FIG. 10. As can be seen from equations 58 to 61, the values of the current sources $I_1(t)$ and $I_2(t)$ are determined by using the appropriate number of circuits of the form shown in FIG. 7 to obtain the values of $K_n$. In this example, three circuits of the form shown in FIG. 7 are used to obtain the values of $K_1$, $K_2$ and $K_3$.

Figure 9:
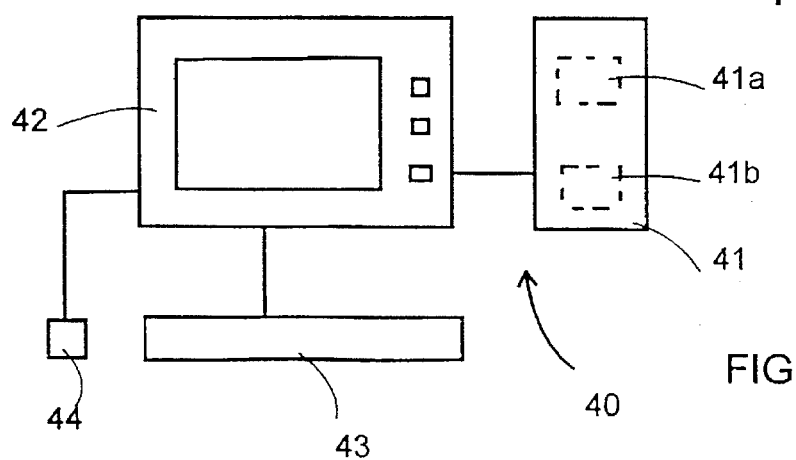
FIG. 9 illustrates schematically apparatus for use in carrying out a method in accordance with the invention.

FIG. 9 illustrates various schematically one possible form of computer system 40 which may be used for carrying out a method in accordance with the invention. The computer system 40 may be any suitable conventional or computer system and could be in the form of a work-station, stand-alone personal computer or a terminal connected to a mainframe computer. In the example shown, the computer system 40 comprises a stand-alone personal computer having the usual processing unit 41 comprising the usual central processor 41a memory in the form of, for example, one or more hard disc drives, optical data storage drives and/or floppy disc drives, 41b and, although not shown in FIG. 9, associated video display drivers etc. The computer system 40 also has a display 42 which may have any suitable form but is generally either a cathode ray tube (CRT) or liquid crystal display (LCD) device. One or more input devices are provided for enabling a user to input information to the computer system 40. In the example shown, the computer system is provided with a keyboard input device 43 and a mouse or like input device 44. Of course, any other suitable forms of input devices may be used.

Circuit simulator software such as PSTAR is stored in the memory 41b of the computer system. Of course, where the computer system comprises a terminal attached to a mainframe or where the computer system is networked to other computer systems, then the software and data may be stored at a central location available to be accessed by the networked computer system or terminal 40. The memory also stores data and software for enabling the distributed effects within a particular device or component to be determined using a method in accordance with the invention so that distributed effects within devices forming a circuit can be taken into account in the circuit simulation.

In order to simulate the operation or functioning of a particular circuit, a user inputs the circuit structure to be simulated to the circuit simulator by identifying each required component, its characterising parameters and the nodes or points to which the component is to be connected so as to provide the circuit simulator with a mesh or net of data which represents the circuit to be simulated. Thus, for example, where the component is a passive component such as a resistor or capacitor, the user will input the desired resistance or capacitance and the node points to which the terminals of the component are to be coupled. In the case of an active device such as a transistor then of course the usual characterising parameters such as the transistor gain etc. will be required. Where the circuit to be simulated includes one or more components such as power pin diodes following the example given above (for example where the circuit is a deflection transistor circuit having a power diode coupled across the emitter and collector terminals of the deflection transistor), then the distributed effects within the device are simulated using a method in accordance with the invention. Thus, the circuit simulator, as is well known in the art, may model the power diode as a non-linear resistor as shown in FIG. 8a. The circuit simulator software will determine the current through (or voltage across) the non-linear resistor 30 and then, using this value for the current (or voltage), the computer system 40 will carry out a method in accordance with the invention to determine P(0,t) and P(w,t) by, for example, simulating the circuit shown in FIG. 8b. This returns to the circuit simulator a value for the voltage (or current) which is dependent, of course, on time and the switching history of the diode. The simulator then determines whether or not the value supplied by the method accords with the value which it expects and if not an iterative process is carried out in which the values supplied by the circuit simulator are adjusted until the value returned by the simulation of the circuit shown in FIG. 8b accords with the value expected by the circuit simulator.

The switching characteristics of the diode shown in FIG. 1 can thus be simulated in a circuit simulator by using the novel approximation described above to determine the boundary conditions. In this example, diffusion of minority carriers across the undepleted part 4' of the second region 4 is modelled using the $\pi$ network shown in FIG. 8 in which each arm of the $\pi$ contains a parallel combination of a resistor, a capacitor and a current source. The values of these components are determined by parameters which characterise the device, of which the diode area, the i-region width, doping level and carrier lifetime are the most important. Most of these characteristics will be available in the data base of the circuit simulator with which a method in accordance with the invention is to be used because they are required for the conventional circuit modelling. However, of course, the user may, if desired, be allowed to input at least some of the parameters using, for example, experimentally obtained data. The resistive elements $R_1$, $R_2$ in the arms of the $\pi$ network reproduce the d.c. relation between the current flow and the boundary minority carrier densities. The capacitive elements $C_1$, $C_2$ in the arms of the $\pi$ network reproduce the transient relationship between the current flow and the boundary minority carrier densities P under conditions in which the rate of change of these boundary values is constant. The current sources $I_1(t)$, $I_2(t)$ in the $\pi$ network represent a corrective term determined entirely by the amplitudes of the decaying terms which are, in turn, determined by the extent to which the time dependence of these boundary values has departed from being a constant at all previous times. The current sources 20 and 21 at the input and output of the $\pi$ network reproduce the influence of current flow through the device and recombination in the contact regions while the input and output voltages reproduce the boundary minority carrier densities. In many circumstances, as indicated above, the use of only three decaying terms is sufficient to provide accurate results.

Although the example has been described above in a manner specifically adapted for circuit simulators such as PSTAR which requires separate elements to determine the coefficients $K_n$, the present invention may be used with any suitable circuit simulator and in some cases, for example with circuit simulators such as SABER, it is not necessary to provide separate circuit model elements such as those shown in FIG. 7 to determine the coefficients $K_n$, rather all that is necessary is to input to the circuit simulator the new differential equation from which these coefficients are derived, that is equation 38 in FIG. 10 in this example.

Depending upon the particular characteristics of the circuit simulator being used, it may be possible simply to input the required information for simulating the distributed effects within the device in an analytical form rather than by having to devise circuit models such as shown in FIGS. 7 and 8 to simulate the distributed effects. To take an example, P (x,t) given by equation 23 may be integrated over the full width w of the undepleted part 4' of the intrinsic or i-region 4 of the diode 1 to develop a so-called charge control model, that is a model in which the charge stored within the device determines its behaviour. Integration of equation 23 shows that the charge Q stored in the i-region 4' may be written as shown in equation 62 in FIG. 10 where $Q_0$ is the charge stored for given steady state values of $P_0$ and $P_w$, and represents the charge stored in the terms 23i in equation 23 as indicated by equation 63 in FIG. 10. $Q_{qi}$ is the additional charge stored for given values of $P_0$ and $P_w$ under conditions in which $P_0$ and $P_w$ evolve at a constant rate with time and represents the charge stored in the terms 23ii in equation 23 as shown by equation 64 in FIG. 10. $Q_n$ represents the charge stored in each of the Fourier terms that represent transient effects and thus represents the charge stored in the terms 23iii in equation 23 as shown by equation 65 in FIG. 10. The differential equation 38 which determines the way the amplitudes of the Fourier terms (variously referred to above as $K_n$, $C_n$ and $B_n$) evolve with time may also be rewritten in terms of $Q_n$ and $Q_{qi}$ as shown by equation 66 in FIG. 10 while the total current $I_i$ recombining in the i-region 4 may be written as shown in equation 67 in FIG. 10. The infinite sum in equation 67 may, typically, again be truncated at the third term. These equations can be directly implemented in circuit simulators such as SABER without the need to derive a circuit analogue and a model for the diode 1 prepared by re-expressing the voltages in equation 41 in terms of the total stored charge.

Although the invention has been described above with reference to diodes, the present invention may be applied to any other physical devices in which distributed effects are represented by a time dependent differential equation, not necessarily the diffusion equation. In particular, in the field of power semiconductor devices, the present invention may be readily applied to other devices in which, for example, long diffusion delays due to the difficulty in extracting charge plasma result in distributed effects which cannot be simulated in a circuit simulator using existing techniques. Thus, for example, devices such as the bipolar junction transistor and the Insulated Gate Bipolar Transistor may be modelled using existing circuit models for these devices but modifying them to incorporate the transient terms in the manner discussed above; for example, by analogy to the diode example given above, by using the appropriate number of the circuits shown in FIG. 7. Generally, as indicated above, only the first three transient terms of the Fourier series will be required, although it may be possible to use only two or there may be circumstances where additional terms of the Fourier series, up to the first four or five say, are necessary.

The present invention may also be applied to the simulating of transmission lines which can, as is well known, functionally be represented as a number of repeating units of the type shown in FIG. 11 in which $R_T$ is a resistance, $G_T$ a conductance and $C_T$. Because of the delays inherent in such transmission lines changes occurring at one end do not instantaneously have an effect at the other end and according there are distributed effects occurring within the transmission line system which follow an equation analogous to the ambipolar diffusion equation 1 in FIG. 10 with $P_0$ and $P_w$ effectively representing the voltages at respective ends of the transmission line section being simulated. The effect of applying a ramped voltage to one end (the $P_0$ end) on the other end (the $P_w$ end) of a transmission line has been simulated. FIG. 12 shows the results of simulating the transmission line using a conventional quasi-static approach within a circuit simulator while FIG. 13 shows a similar graph of the results of using a method in accordance with the invention for simulating the transmission line. The left and right hand vertical axes in FIGS. 12 and 13 represent $P_0$ and $P_w$, respectively while the horizontal axis gives time t in $10^{-7}$ seconds. In FIG. 12, the lines 50 and 51 (carrying, respectively, circles and triangles as identifying marks) represent respectively $P_0$ calculated analytically and by using the quasi static approximation while the lines 52 and 53 (carrying, respectively, lines and crosses as identifying marks) represent respectively $P_w$ calculated analytically and by using the quasi static approximation. In FIG. 13, the lines 50 and 54 (carrying, respectively, circles and triangles as identifying marks) represent respectively $P_0$ calculated analytically and by using a method in accordance with the invention of simulating the distributed effects while the lines 52 and 55 (carrying, respectively, lines and crosses as identifying marks) represent respectively $P_w$ calculated analytically and by using a method in accordance with the invention. As can be seen clearly from a comparison of FIGS. 12 and 13, while both the quasi-static approach (line 51 in FIG. 12) and a method in accordance with the invention (line 54 in FIG. 13) fit the analytical solution (line 50) for $P_0$, the situation is different for the other end $P_w$ of the transmission lime section. Thus, the quasi-static solution for $P_w$ (line 53 in FIG. 12) does not take into account the delays introduced by distributed effects within the transmission line and so deviates from the analytical solution (line 52) while the solution (line 55 in FIG. 13) given by a method in accordance with the invention agrees with the analytical solution (line 52). As is known by those skilled in the art, transmission lines can be use in the modelling or simulating of semiconductor devices.

The results obtained using a method in accordance with the invention should facilitate the design of circuits by a circuit designer and should lead to more reliable and cheaper circuit designs because of the increased ease and reliability with which the characteristics of the circuit components such as power semiconductor devices can be predicted using a method in accordance with the invention.

It will of course be appreciated that although the present invention as been described above with reference to the use of a computer based circuit simulator, in the case where a method in accordance with the invention is simulated using circuit models as discussed above with reference to FIG. 7 and 8, the present invention could equally well be applied to a situation where the device under consideration is simulated by a hard wired circuit formed using real circuit components which may for convenience have variable values to enable the necessary adjustments to be made easily.

From reading the present disclosure, other modifications and variations will be apparent to persons skilled in the art. Such modifications and variations may involve other features which are already known in the art and which may be used instead of or in addition to features already described herein. Although claims have been formulated in this application to particular combinations of features, it should be understood that the scope of the disclosure of the present application also includes any novel feature or combination of features disclosed herein either explicitly or implicitly, whether or not relating to the same invention as presently claimed in any claim and whether or not it mitigates any or all of the same technical problems as does the presently claimed invention. The applicants hereby give notice that new claims may be formulated to such features and/or combinations of such features during prosecution of the present application or of any further application derived therefrom.

I claim:

1. A method for generating a simulation program for automatically simulating time dependent characteristics of a device to enable the operation of the device within a larger circuit to be simulated by a circuit simulator program which contains a computer model of the device to facilitate the designing of circuits incorporating such a device, which method comprises using a computer system to solve a time dependent differential equation using boundary conditions which define the time dependent characteristics as evolving at a constant rate for a given time interval such that only a small number of transient terms are required for the solution;

causing the rate of change of the distributed effect or boundary minority carrier density to change after the given time interval so that the rate of change is constant but different in the given time interval and in a further succeeding similar time interval; and using the solution of the time dependent differential equation to modify the computer model of the device contained within the simulator program to enable the time dependent characteristics of the device to be simulated.

2. A method for generating a simulation program for automatically simulating time dependent characteristics of a device to enable the operation of the device within a larger circuit to be simulated by a circuit simulator program which contains a computer model of the device to facilitate the designing of circuits incorporating such a device, which method comprises using a computer system to solve a time dependent differential equation using boundary conditions which define the time dependent characteristics as evolving at a constant rate for a given time interval such that only a small number of transient terms are required for the solution and using the solution of the time dependent differential equation to modify the computer model of the device contained within the simulator program to enable the time dependent characteristics of the device to be simulated, the method further comprising generating a simulation program for automatically simulating distributed or switching characteristics of a semiconductor device comprising a diode structure having a semiconductor region which is relatively lowly doped and undepleted in operation of the device by using the computer system to solve the time-dependent diffusion equation by defining the minority charge carrier density conditions at the boundaries of the semiconductor region as evolving at a constant rate for a given time interval to provide a solution of the time-dependent diffusion equation having a first component representing a steady state part of the relationship between the current flow and the minority carrier densities at the boundaries of the semiconductor region, a second component representing a time varying part of the relationship between the current flow and the minority carrier densities at the boundaries of the semiconductor region under conditions in which the rate of change of the boundary values is constant for a given time interval and a third component for representing a series transient terms which decay with time, the boundary conditions being such that only a first few of the series of transient terms are required for the solution.

3. A method according to claim 2, which comprises representing the first, second and third components of the time-dependent diffusion equation within the simulation program as respective charges stored within the diode structure for the first, second and third parts of the solution, and a recombination current.

4. A method according to claim 2, which further comprises representing the solution of the time-dependent diffusion equation within the simulation program as a circuit comprising first, second and third circuit elements representing, respectively, the first, second and third components and providing within the simulation program input and output current source components for reproducing the influence of current flow through the semiconductor device and of recombination and input and output voltages for reproducing the minority carrier densities.

5. A method according to claim 4, which comprises representing the solution of the time-dependent diffusion equation within the simulation program as a circuit comprising a $\pi$ network in which each arm of the $\pi$ contains a parallel combination of a resistor, a capacitor and a current source having values determined by the given parameters.

6. A method according to claim 4 which comprises determining the value of each current source within the circuit using a respective subsidiary circuit comprising a parallel combination of a resistor, a capacitor and a current source.

7. A method for simulating time dependent characteristics of a device to enable the operation of that device to be determined, which method comprises solving the time-dependent differential equation using boundary conditions which define the time dependent characteristics as evolving at a constant rate for a given time interval such that only a small number of transient terms are required for the solution, devising a model for the device using the solution of the time dependent differential equation determined using those boundary conditions and using the model to determine the time dependent characteristics of the device, the method further comprising the step of causing the rate of change of the distributed effect or boundary minority carrier density to change after the given time interval so that the rate of change is constant but different in the given time interval and in a further succeeding similar time interval.

8. A computer system storing a simulation program for simulating time dependent characteristics of a device to enable the operation of the device within a larger circuit to be simulated by a circuit simulator program containing a computer model of the device to facilitate the designing of circuits incorporating such a device, which computer system comprises means for solving a time dependent differential equation using boundary conditions which define the time dependent characteristics as evolving at a constant rate for a given time interval such that only a small number of transient terms are required for the solution;

means for causing the rate of change of the distributed effect or boundary minority carrier density to change after the given time interval so that the rate of change is constant but different in the Given time interval and in a further succeeding similar time interval; and means for using the solution of the time dependent differential equation to modify the computer model of the device contained within the simulator program to enable the time dependent characteristics of the device to be simulated.

9. A computer system storing a simulation program for simulating time dependent characteristics of a device to enable the operation of the device within a larger circuit to be simulated by a circuit simulator program containing a computer model of the device to facilitate the designing of circuits incorporating such a device, which computer system comprises means for solving a time dependent differential equation using boundary conditions which define the time dependent characteristics as evolving at a constant rate for a given time interval such that only a small number of transient terms are required for the solution and means for using the solution of the time dependent differential equation to modify the computer model of the device contained within the simulator program to enable the time dependent characteristics of the device to be simulated, the computer system further comprising means for generating a simulation program for automatically simulating distributed or switching characteristics of a semiconductor device comprising a diode structure having a semiconductor region which is relatively lowly doped and undepleted in operation of the device by using the computer system to solve the time-dependent diffusion equation by defining the minority charge carrier density conditions at the boundaries of the semiconductor region as evolving at a constant rate for a given time interval to provide a solution of the time-dependent diffusion equation having a first component representing a steady state part of the relationship between the current flow and the minority carrier densities at the boundaries of the semiconductor region, a second component representing a time varying part of the relationship between the current flow and the minority carrier densities at the boundaries of the semiconductor region under conditions in which the rate of change of the boundary values is constant for a given time interval and a third component for representing a series transient terms which decay with time, the boundary conditions being such that only a first few of the series of transient terms are required for the solution.

10. A computer system according to claim 9, which comprises means for representing the solution of the time-dependent diffusion equation within the simulation program as respective charges stored within the diode structure for the first, second and third components of the solution, and a recombination current.

11. A computer system according to claim 9, which comprises means for representing the solution of the time-dependent diffusion equation within the simulation program as a circuit comprising first, second and third circuit elements representing, respectively, the first, second and third components and for providing within the simulation program input and output current source components for reproducing the influence of current flow through the semiconductor device and of recombination and input and output voltages for reproducing the minority carrier densities.

12. A method according to claim 11, wherein the circuit stored within the simulation program comprises a $\pi$ network in which each arm of the $\pi$ contains a parallel combination of a resistor, a capacitor and a current source having values determined by the given parameters.

13. A computer system according to claim 9, wherein the simulation program provides a subsidiary circuit comprising a parallel combination of a resistor, a capacitor and a current source for enabling each transient term of the third component to be simulated.

14. A computer system simulator according to claim 9, wherein the simulator program stores a non-linear resistor as the computer model of the diode structure.

* * * * *